Feb. 24, 1970 R. J. PHELAN, JR., ET AL 3,497,698

METAL INSULATOR SEMICONDUCTOR RADIATION DETECTOR

Filed Jan. 12, 1968

INVENTORS
ROBERT J. PHELAN JR.
JOHN O. DIMMOCK

BY Robert T Dunn
ATTORNEY

United States Patent Office 3,497,698
Patented Feb. 24, 1970

3,497,698
METAL INSULATOR SEMICONDUCTOR RADIATION DETECTOR

Robert J. Phelan, Jr., and John O. Dimmock, Concord, Mass., assignors to Massachusetts Institute of Technology, Cambridge, Mass., a corporation of Massachusetts Filed Jan. 12, 1968, Ser. No. 697,418
Int. Cl. H01j 39/12
U.S. Cl. 250—212 16 Claims

ABSTRACT OF THE DISCLOSURE

A photodiode is formed by a structure consisting of an insulating layer on the surface of a semiconductor and a metal film on the surface of the insulator. Starting with a semiconductor of given conductivity type, a high electric field is produced in the semiconductor in a region immediately adjacent to the insulator to form a p-n-like semiconductor junction. In one embodiment, the thickness of the insulating layer is determined to provide a capacitance in series with the p-n-like junction which is substantially greater than the intrinsic shunt capacitance of the junction so that when the structure is energized with electrical or optical pulses, the junction shunt capacitance charges during the interval of a pulse, but the series capacitance does not and so a strong photovoltaic response to selected radiation incident on the p-n junction is exhibited.

The invention herein described was made in the course of work performed under a contract with the Electronics Systems Division, Air Force Systems Command, United States Air Force.

The invention relates to semiconductor radiation detectors and more particularly to a metal insulator semiconductor (MIS) so designed to provide a photodiode for which photon collection quantum efficiency is relatively high in series with a capacitor.

One type of photovoltaic cell for detecting radiation contains a thin barrier layer on a semiconductor surface, which produces a voltage depending upon the incident radiation. These cells need no external power supply as do photoconductive cells. An example of such a barrier-type photovoltaic cell is the selenium cell which can convert incident light into electric current sufficient to actuate a meter. The barrier-type selenium photovoltaic cell is one common type of semiconductor photocell and has an efficiency of conversion of incident radiation to electrical energy of up to about 1 percent. It responds to alternating light intensity if the frequency is not more than a few thousand cycles. The selenium barrier-type photovoltaic cell is prepared by vapor growth of a selenium layer on a semiconductor base so that a p-n junction forms between. Then a counter electrode, which is preferably transparent, is evaporated or sputtered on the selenium and electrical contact is made to the counter electrode.

Barrier-layer photovoltaic cells have also been made with copper oxide, lead sulfide, silver sulfide and other semiconductor materials. Generally, these cells are made by procedures similar to those used to make rectifiers of the same materials.

It is an object of the present invention to provide a solid state photocell responsive to infrared radiation.

It is another object of the present invention to provide an efficient solid state radiation detector which may be used as a photoconductive cell or photovoltaic cell.

It is another object of the present invention to provide a solid state photocell of greater efficiency than many of the devices used heretofore.

It is another object of the present invention to provide a photovoltaic cell which is substantially more efficient than the selenium barrier-layer photovoltaic cells used in the past.

It is another object of the present invention to provide a metal insulator semiconductor photocell which can be fabricated by employing advantageous reliable techniques developed in the formation of metal insulator semiconductor (MIS) devices.

In the present invention, high quantum efficiency is obtained in the response of a photocell to infrared radiation. A photovoltaic cell incorporating features of the invention is a metal insulator semiconductor structure which produces a high response to incident radiation due to the generation of electron-hole pairs in a depletion region formed in the semiconductor body adjacent to the insulating layer. The depletion region is a space charge region of high electric field and forms a p-n-like junction at the semiconductor surface. Thus, in effect, the electrical equivalent of the detector is a capacitance in series with a diode. The capacitance is determined largely by the thickness of the insulating layer and the diode is formed by the depletion region.

The semiconductor material is preferably selected to provide a photovoltaic response to a selected radiation wavelength and the insulating layer is selected in consideration of the semiconductor material. One type of semiconductor material that has been found to be suitable is n-type InSb with a bulk concentration of between $10^{14}$ and $10^{16}/cm.^3$. The insulating layer may be produced by anodizing the surface of the body of InSb to form an oxide, or by depositing a layer of pyrolytic $SiO_2$ on the surface of the InSb. Both these techniques have yielded high internal quantum efficiency in the conversion of infrared radiation into electrical energy.

The InSb metal oxide semiconductor photovoltaic cell uses a relatively large area InSb chip, which may be anodized to form the oxide layer. Then a conductive film is evaporated thereon to form a counter electrode. This provides the electrical equivalent of a MOS capacitance in series with a diode, the magnitude of the capacitance being determined by the thickness of the oxide layer. Such a device has been found most useful as a detector of infrared radiation when the MOS capacitance defined by the thickness of the oxide layer is substantially greater than the intrinsic shunt capacitance across the diode. When such a detector is electrically energized by pulses of sufficient duration to just charge the shunt capacitance, but not to charge appreciably the MOS capacitor, the incident radiation intensity can be readily measured by measuring the diode voltage and current. It has been found that such operation yields very high internal quantum efficiency which approaches 100 percent. The external efficiency is limited by reflection and absorption losses and has been observed to be about 25 percent. This use and other uses can be made of the large area metal insulator (or oxide) semiconductor photocell described herein.

Other features and objects of the present invention will be apparent from the following specific description taken in conjunction with the figures in which.

Figure 1:
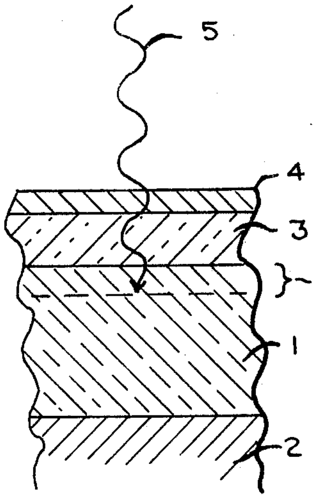
FIGURE 1 is a cross section view illustrating the principal structural features of the metal insulator semiconductor photocell which can be used as a photoconductive device or a photovoltaic device.

In some embodiments of the present invention, referred to generally as MIS radiation detectors, the radiation detector is formed employing well-known techniques for preparing a metal insulator semiconductor structure. Thus, the detector is formed without the use of elevated temperatures of diffusion or the required control and processing necessary in the state-of-art techniques employed to grow p-n junctions.

The photocell detector in the present invention is illustrated in elemental form, called herein a metal insulator semiconductor radiation detector (MIS radiation detector is formed employing well-known techniques URE 1. The MIS structure consists of a large area semiconductor body 1 on a conductive base 2. An insulator layer 3 is formed on a surface of the semiconductor over a relatively large area of the surface, which may be as large as many square centimeters, and an electrically conductive film 4 is formed on the insulator layer. The conductive film 4 is preferably semitransparent to the radiation 5 which is to be detected. This is preferred because the radiation is directed to a depletion region 6 in the semiconductor body 1 immediately adjacent the insulator layer. It is quite possible to direct the incident radiation to the depletion region without going through the electrically conductive layer 3; however, radiation losses are minimized by directing the radiation through a conductive layer 4 which is substantially transparent.

A MOS radiation detector of one kind is made of a semiconductor body 1 of n-type InSb and the insulator layer 3 is an oxide obtained by anodizing the surface of the InSb or by depositing a uniform film of an oxide such as pyrolytic $SiO_2$ on the surface of the InSb. The model for the band curvature in such a semiconductor material 1 near the oxide interface indicates that a surface conductivity depletion region is produced, defined herein as the depletion region 6. Thus, the depletion region 6 defines a p-n-like junction or diode in series with the capacitance defined by layers 4, 3 and 6. When the conductive layer 4 is a metal, this capacitance may be termed the MOS capacitor, because it includes the metal layer 4, the oxide layer 3, and the semiconductor layer 6.

In operation of the MOS or the MIS structures, the incident radiation 5 produces electron-hole pairs in the depletion region and so a voltage is produced across the depletion region. This voltage is the photovoltaic voltage produced in response to the incident radiation and can be measured to yield a measure of the intensity of the radiation.

Figure 2:
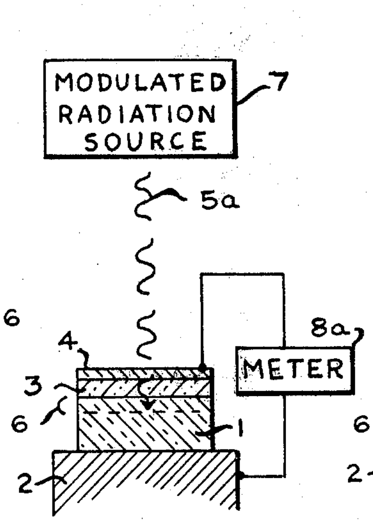
FIGURES 2 and 3 illustrate use of the metal insulator photocell as a substantially, entirely photovoltaic device and a combination photoconductive, photovoltaic device, respectively.

FIGURE 2 illustrates use of the MOS or MIS detector as a substantially purely photovoltaic device. The incident radiation 5*a* is modulated or intermittent. This may be accomplished by mechanically modulating the radiation from a steady source or employing a modulated radiation source 7. The detector is not energized electrically and so the incident radiation must be modulated in order that the electrical response of the detector at the depletion layer 6 be conducted by the MOS capacitor to the meter 8*a*.

Figure 4:
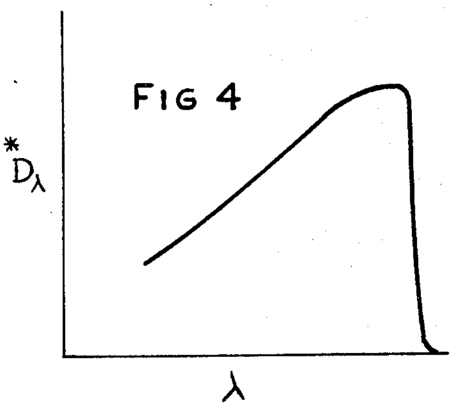
FIGURE 4 is a plot of $D_\lambda$* ( a common figure of merit for infrared detectors) versus the wavelength $\lambda$ of incident infrared radiation for a large area InSb metal oxide semiconductor structure constructed as described herein.

In operation, the radiation source 7 may be an injection laser diode electrically pulsed at a convenient rate to produce pulses of infrared radiation 5*a*. With a detector such as the InSb MOS detector constructed as described above, with reference to FIGURE 1, the source may be a GaAs injection laser diode electrically pulsed at a rate from a few cps. to 30 kc. or higher. The InSb MOS detector is preferably operated in a vacuum at liquid nitrogen temperature. The spectral response of such an InSb MOS structure is shown in the plot in FIGURE 4. This is a plot of $D_\lambda^*$ versus $\lambda$. $D_\lambda^*$ is a common figure of merit for infrared detectors defined by the relationship:

$$D_\lambda^* = \frac{V_s(A_D \Delta f)^{1/2}}{V_N P_\lambda}$$

where $V_s$ is the r.m.s. signal voltage, $V_N$ is the r.m.s. noise voltage, $A_D$ is the detector area, $\Delta f$ is the electronic bandwidth of the measuring apparatus, and $P_\lambda$ is the incident radiation power at the wavelength $\lambda$. This response spectrum is characteristic of excitation across the gap in InSb and extends to an incident radiation wavelength of 5.4 microns. The peak value of $D_\lambda^*$ compares favorably with other photovoltaic detectors.

Figure 3:
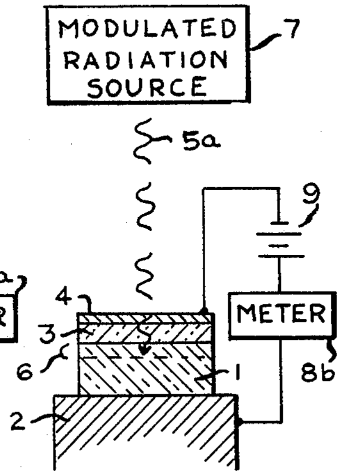

FIGURE 3 illustrates use of the MOS or MIS detector as partially photoconductive, partially photovoltaic device. In this embodiment, the detector is electrically energized by a DC potential from battery 9 connected in series with the detector and meter 8*b*. The electric field produced by the DC potential in the semiconductor body 1 contributes to produce the depletion region 6 and depending on the semiconductor material and the insulating material in layer 3, the DC field provided by the battery will be the primary cause of the depletion region 6 or a minor cause.

In this embodiment, the radiation 5*a* must be modulated just as in the embodiment of FIGURE 2 described above. The electric signal produced in the detector in response to the modulated radiation is measured by the meter 8*b*. This meter may be a voltage or current measuring device or it may measure both. The electric parameter which varies the greatest to the effects of the incident radiation depends on the extent to which the detector responds to the radiation as a photovoltaic detector or as a photoconductive detector.

Either of the radiation detectors shown in FIGURE 2 or 3 may be constructed with an insulating layer 3 which is not an oxide. For example, in an MIS structure, the insulating layer 3 may be silicon nitride, lithium fluoride, a layer of photoresist material or thin plastic film such as Teflon. These insulating materials, as well as oxides, may be employed with semiconductor materials such as silicon, germanium, lead selenide, lead telluride and various low band gap lead-tin salt alloys.

Should the depletion region produced in the semiconductor by the insulator layer be insufficient for operation as a substantially purely photovoltaic detector, as shown in FIGURE 2, then the DC voltage from a battery can be added, as shown in FIGURE 3, to produce a sufficient depletion region.

Figures 5, 6:
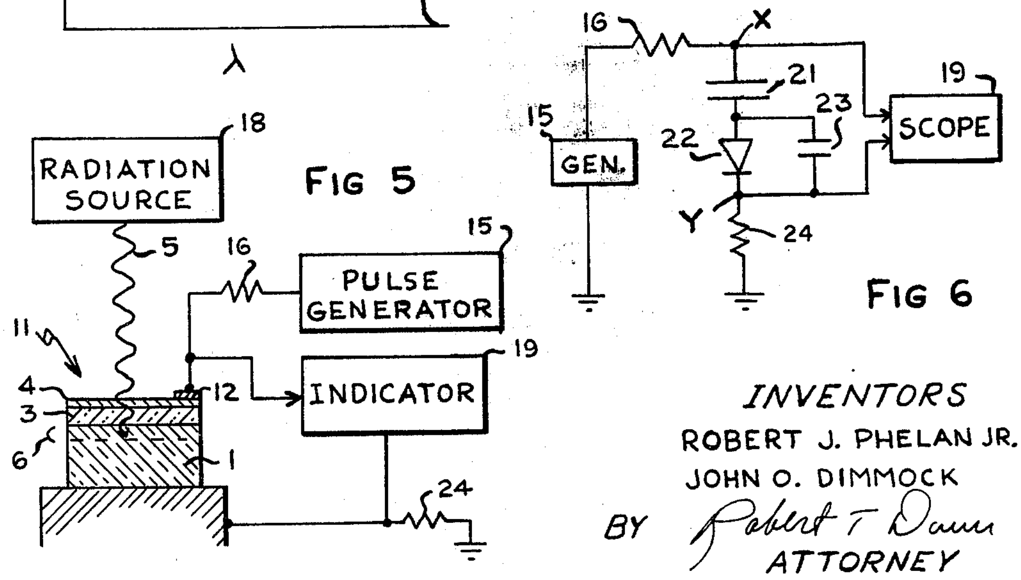
FIGURE 5 is a partially sectioned view of equipment and a detector incorporating features of the present invention.
FIGURE 6 is an equivalent electrical diagram of the equipment and detector shown in FIGURE 5.

FIGURE 5 shows apparatus for measuring the response of the MOS or MIS detectors of the present invention to incident radiation, which may be steady, intermittent, or modulated. The detector 11 is constructed substantially as described above with reference to FIGURE 1. More particularly, an InSb MOS detector may be constructed as follows. A chip of n-type InSb having a bulk n-type concentration of between 1 and $1.2 \times 10^{14}$/cm.$^3$ and a Hall mobility greater than $7 \times 10^5$ cm.$^2$/v. sec. is lap polished at one surface. The surface is then etched with a 2:1:1 volume ratio of HF, $HNO_3$ and $CH_3COOH$ to remove the damaged layer and rinsed with dilute HF to remove any remaining oxide. It is then rinsed further with de-ionized water and methyl alcohol.

The oxide coating on the chip of InSb is produced by anodizing the surface of the InSb using a .1 N KOH solution. The anodization can easily be controlled to produce large area uniform oxide layers. The thickness and uniformity may be determined from the interference colors of the oxide. By such methods, the thickness of the oxide film 3 can be kept in the neighborhood of about 500 A. Next, a nickel film 4 is evaporated onto the oxide to form a thickness of about 100 A. Then a small opaque area of gold 12 is evaporated on the nickel to accommodate spring contacts.

In order to examine the capacitance-diode characteristics of the InSb MOS detector, and also detect incident radiation, electrical connection is made from the gold film 12 to a pulse generator 15 via an input resistor 16, so that electrical pulses of a predetermined length and rate can be applied to the detector 11.

The InSb MOS detector 11 is preferably operated in a vacuum at very low temperatures. In operation, the infrared radiation 5 from a source 18 is directed to the detector 11 and this radiation is transmitted through the substantially transparent conductive layer 4 and through the oxide layer 3 to the p-n-like junction or diode defined by the depletion layer 6, where the radiation produces electron-hole pairs.

The photovoltaic response of the detector 11 to the incident radiation 5 is measured as the voltage across the p-n-like junction. This can be conveniently measured by an indicator 19 which may be an oscilloscope that measures the voltage at the gold film 12 during the interval of a pulse from the pulse generator 15. This voltage is a measure of the photovoltaic response provided that the MOS capacitor (defined herein as the capacitance formed by the layers 4, 3 and 6, shown in FIGURE 3) is not charged and provided the shunt capacitance which is the intrinsic capacitance across the p-n-like junction itself is fully charged. This condition can be insured by making the oxide film 3 sufficiently thin so that the MOS capacitance is much greater than the intrinsic shunt capacitance across the junction and provided the pulses from the generator 15 are of proper duration, such that they do not charge the MOS capacitor, but do charge substantially the shunt capacitor.

A simplified schematic of the electrical equivalents of the setup shown in FIGURE 5 is illustrated by the electrical diagram shown in FIGURE 6. In FIGURE 6, the large area InSb MOS detector, or a MIS detector if employed, is shown as a capacitance 21 in series with a diode 22. Thus, the capacitance 21 is the MOS capacitor formed by the layers 4, 3 and 6, shown in FIGURE 1, and the diode 22 is the p-n-like junction defined by the depletion region 6. The intrinsic shunt capacitance of the diode is represented by capacitor 23 and the impedance to ground from the base 2 of the detector 11 is represented by resistor 24.

In operation, the pulse generator 15 provides pulses of varying amplitude through the input impedance 16. Since the MOS capacitor 21 is much greater than the diode shunt capacitance 23, a pulse from the generator 15 charges the diode capacitance 23 before significantly charging the MOS capacitor 21. Thus, the voltages measured at points X and Y represent current and voltage, respectively, across the diode 22 when these voltages at X and Y are sampled toward the end of each of the pulses. For example, when the pulse lengths are less than 1 microsecond and the surface area of the InSb MOS detector is about 4 square millimeters, the voltage-current (V and I) response of the detector is represented by FIG. 7.

Figure 7:
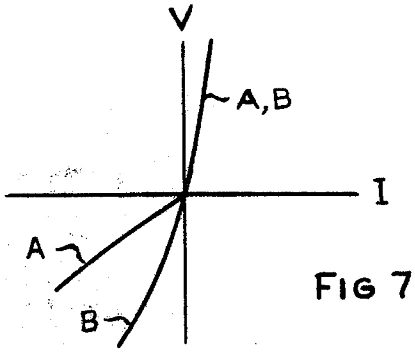
FIGURE 7 is a plot illustrating current-voltage characteristics of the large area InSb metal oxide semiconductor structure obtained by sampling current and voltage during the interval of one microsecond energizing pulses applied to the structure, the upper curve A corresponding to an illumination with room radiation and the lower curve B corresponding to an illumination from a source of infrared.

FIGURE 7 shows the voltage-current characteristics of the p-n-like junction. It is obtained by plotting the voltages at points X and Y in the circuit in FIGURE 2. The upper curve A in FIGURE 5 corresponds to an illumination of the detector 11 with ordinary room radiation and the lower curve B corresponds to illumination of the detector with infrared radiation from a globar source (source 18) of known radiation intensity. The results are equivalent to what one would expect to obtain from a photodiode in series with a capacitor. From the vertical displacement in the reverse bias region (quadrant 3 in FIGURE 7) obtained for the InSb MOS detector constructed as described herein, the external quantum efficiency is determined to be at least 25 percent. This efficiency is consistent with the measured transmission of the nickel film and the reflectivity of the InSb and indicates that the internal quantum efficiency is close to 100 percent. Quite clearly, the efficiency can be increased by putting a dielectric on the nickel film so that more of the incident radiation gets to the depletion layer 6 in the InSb or by using a thinner nickel film.

As already mentioned, the insulating layer can be formed by other means than by anodizing the surface of the InSb. For example, a layer of pyrolytic $SiO_2$ can be substituted for the anodized film and the same sort of depletion region will result and the same high quantum efficiency will be obtained. In any case, since the depletion region is substantially at the surface, the absorption of light occurs in a high field region yielding high collection efficiency. These results show that the MOS or MIS structures of InSb described herein, as well as similar structures of other low band gap semiconductors are very useful as highly efficient infrared photocells.

Quite clearly, the basic large area MIS or MOS structures described herein can be used as photoconductive or photovoltaic devices. Furthermore, they can be electrically energized by pulses to detect steady or fluctuating incident radiation or they can be electrically energized by a DC voltage to detect modulated incident radiation. These alternative uses are illustrated in FIGURES 2, 3 and 5. Depending on how used, measurements of voltage or current changes or both across the structure yield a measure of the intensity of the incident radiation.

The various embodiments described herein are made by way of example and variations within the state of the art may be made within the scope of the invention as set forth in the accompanying claims:

1. A radiation detector comprising,
a body of semiconductor material of given conductivity type,
a layer of insulator at a surface of said body producing a charge depletion region in said semiconductor body,
a layer of electrically conductive material on said layer of insulator,
means for directing radiation to said semiconductor material, and
utilization means electrically coupled to said body,
the capacitance across said insulator layer being substantially greater than the capacitance across said depletion region.

2. A radiation detector as in claim 1 and in which, said electric charge depletion region forms a p-n-like diode junction in said semiconductor body.

3. A radiation detector as in claim 1 and further including,
means for applying an electrical voltage to said layer of electrically conductive material to cause in said semiconductor immediately adjacent to said layer of insulator said electric charge depletion region which forms a p-n-like diode junction in said semiconductor body.

4. A radiation detector as in claim 1 and in which, said layer of insulator is an oxide.

5. A radiation detector as in claim 1 and in which, said layer of insulator is formed by anodizing said surface of said semiconductor body.

6. A radiation detector as in claim 4 and in which, said oxide is $SiO_2$.

7. A radiation detector as in claim 1 and in which, said layer of electrically conductive material is at least partially transparent to said radiation and said radiation is directed through said electrically conductive layer to said semi-conductor material.

8. A radiation detector as in claim 1 and in which, said semiconductor material is n-type InSb.

9. A radiation detector as in claim 7 and in which, said electrically conductive layer is nickel.

10. A radiation detector as in claim 2 and in which, the thickness of said layer of insulator is such that said capacitance across said insulator layer is substantially greater than the intrinsic shunt capacitance across said p-n-like junction diode.

11. A radiation detector as in claim 3 and in which, the thickness of said layer of insulator is such that said capacitance across said insulator layer is substantially greater than the intrinsic shunt capacitance across said p-n-like junction diode.

12. A radiation detector as in claim 1 and in which, said radiation is modulated and said utilization means is an electrical signal responsive device, electrically coupled with said detector.

13. A radiation detector as in claim 12 and further including,
means for applying a DC electrical voltage to said layer of electrically conductive material.

14. A radiation detector as in claim 1 and further including,
means for applying an AC electrical voltage to said layer of electrically conductive material.

15. A radiation detector as in claim 10 and further including,
means for applying electrical pulses to said electrically conductive layer of duration such that said intrinsic shunt capacitance is substantially charged by a pulse, but said capacitance across said layer of insulator is not substantially charged.

16. A radiation detector as in claim 11 and further including, means for applying electrical pulses to said electrically conductive layer of duration such that said intrinsic shunt capacitance is substantially charged by a pulse, but said capacitance across said layer of insulator is not substantially charged.

References Cited

UNITED STATES PATENTS

| | | | |
|---|---|---|---|
| 2,963,390 | 12/1960 | Dickson. | |
| 3,040,980 | 6/1962 | Mann et al. | 250—218 |
| 3,292,058 | 12/1966 | Hass et al. | 317—235.27 |
| 3,307,089 | 2/1967 | Yamashita | 317—235.27 |
| 3,372,317 | 3/1968 | Yamashita | 317—235.27 |
| 3,391,282 | 7/1968 | Kabell. | |

OTHER REFERENCES

Cherry, "Photovoltaic Conversion 5. Advanced Photovoltaic Devices," Session on Solar Energy Conversion, 1960, pp. 37–42.

Steele, "Amplifier Using Impact Ionization," RCA Technical Notes, No. 719, June 1967, 317-235-27.

ARCHIE R. BORCHELT, Primary Examiner

C. M. LEEDOM, Assistant Examiner

U.S. Cl. X.R.

136—89; 250—211; 317—235-27